(12) United States Patent
Nakamura et al.

(10) Patent No.: US 7,859,058 B2
(45) Date of Patent: Dec. 28, 2010

(54) SEMICONDUCTOR DEVICE HAVING A SRAM WITH A SUBSTRATE CONTACT AND METHOD FOR FABRICATING THE SAME

(75) Inventors: Masayuki Nakamura, Toyama (JP); Satoshi Ishikura, Osaka (JP); Takayuki Yamada, Toyama (JP)

(73) Assignee: Panasonic Corporation, Osaka (JP)

( * ) Notice: Subject to any disclaimer, the term of this patent is extended or adjusted under 35 U.S.C. 154(b) by 148 days.

(21) Appl. No.: 11/480,909

(22) Filed: Jul. 6, 2006

(65) Prior Publication Data

US 2007/0007617 A1 Jan. 11, 2007

(30) Foreign Application Priority Data

Jul. 7, 2005 (JP) .............................. 2005-198329

(51) Int. Cl.
*H01L 27/088* (2006.01)
(52) U.S. Cl. ...................................... 257/368; 257/375
(58) Field of Classification Search .................................
257/E27.098–E27.101, 503, 262, 368, 375, 257/389, 390, 401, 903, 904
See application file for complete search history.

(56) References Cited

U.S. PATENT DOCUMENTS

| | | | | | |
|---|---|---|---|---|---|
| 5,396,100 | A | * | 3/1995 | Yamasaki et al. | ............ 257/390 |
| 5,777,920 | A | * | 7/1998 | Ishigaki et al. | .............. 365/154 |
| 6,501,138 | B1 | | 12/2002 | Karasawa | |
| 6,577,021 | B2 | | 6/2003 | Morishima et al. | |
| 6,635,937 | B2 | * | 10/2003 | Ootsuka et al. | ............. 257/379 |
| 6,717,267 | B1 | * | 4/2004 | Kunikiyo | ..................... 257/758 |
| 6,762,444 | B2 | * | 7/2004 | Ootsuka et al. | ............. 257/288 |
| 6,967,866 | B2 | * | 11/2005 | Hirata et al. | ................ 365/174 |
| 2002/0024064 | A1 | * | 2/2002 | Shibata et al. | ............. 257/207 |
| 2005/0281119 | A1 | * | 12/2005 | Shibata et al. | ......... 365/230.06 |
| 2007/0235764 | A1 | * | 10/2007 | Chang et al. | ................ 257/206 |

FOREIGN PATENT DOCUMENTS

| | | |
|---|---|---|
| JP | 2000-357750 | 12/2000 |
| JP | 2002-373946 | 12/2002 |
| JP | 2004-39902 A | 2/2004 |
| JP | 2005-039294 | 2/2005 |

OTHER PUBLICATIONS

Japanese Notice of Reasons for Rejection, w/ English translation thereof, Issued in Japanese Patent Application No. JP 2006-130024 dated Mar. 2, 2010.

Japanese Notice of Reasons for Rejection, w/ English translation thereof, issued in Japanese Patent Application No. JP 2006-130024 dated May 25, 2010.

* cited by examiner

*Primary Examiner*—Wai-Sing Louie
*Assistant Examiner*—Bilkis Jahan
(74) *Attorney, Agent, or Firm*—McDermott Will & Emery LLP

(57) ABSTRACT

An isolation insulating film is formed so that an active region of a first access transistor and a substrate contact region can be integrated with each other in a plan view. A dummy gate electrode is formed on the semiconductor substrate between the active region of the first access transistor and the substrate contact region. The dummy gate electrode is electrically connected to a P-type impurity region of the substrate contact region.

15 Claims, 9 Drawing Sheets

US 7,859,058 B2

SEMICONDUCTOR DEVICE HAVING A SRAM WITH A SUBSTRATE CONTACT AND METHOD FOR FABRICATING THE SAME

BACKGROUND OF THE INVENTION

The present invention relates to a semiconductor device and a method for fabricating the same, and more particularly, it relates to a semiconductor device equipped with an SRAM and a method for fabricating the same.

Refinement of semiconductor devices equipped with SRAMs has been conventionally accelerated to meet demands for large capacity and a high degree of integration. Owing to the structure of an SRAM, it is necessary to dispose substrate contact regions at a given interval in a memory cell array for obtaining potential of a drain region of a driver transistor. Therefore, it is necessary to consider not only a memory cell but also a substrate contact region in examination for refinement.

In a conventional semiconductor device equipped with a general SRAM, a substrate contact region is separated from an adjacent N-type MIS transistor by an isolation region (see, for example, Japanese Laid-Open Patent Publication No. 2004-39902).

Now, a conventional semiconductor device equipped with an SRAM and a method for fabricating the same will be described with reference to FIGS. 8A, 8B and 9A through 9E. FIG. 8A is a plan view for showing the structure of the conventional semiconductor device equipped with an SRAM and FIG. 8B is a cross-sectional view thereof taken on line C-C of FIG. 8A. As shown in FIGS. 8A and 8B, an active region 200a of a first driver transistor TrD1, an active region 200b of a second driver transistor TrD2, an active region 200c of a first access transistor TrA1, an active region 200d of a second access transistor TrA2 and a substrate contact region 200e are separated from one another by isolation insulating films 206a and 206b in the conventional semiconductor device.

Gate electrodes 209a, 209b, 209c and 209d are respectively formed on the active regions 200a, 200b, 200c and 200d of the transistors TrD1, TrD2, TrA1 and TrA2. Also, contact plugs 215a through 215h are formed on both sides of the gate electrodes 209a through 209d in the active regions 200a through 200d. The contact plugs 215a through 215h are respectively connected to metal lines 217a through 217h.

Next, the method for fabricating the conventional semiconductor device equipped with an SRAM will be described with reference to FIGS. 9A through 9E. FIGS. 9A through 9E are cross-sectional views for showing procedures in fabrication of the conventional semiconductor device equipped with an SRAM. In FIGS. 9A through 9E, the cross-section taken on line C-C of FIG. 8A is shown.

In the fabrication method for the conventional semiconductor device, a silicon oxide film 201 and a silicon nitride film 202 are first formed on a semiconductor substrate 200 by a known film forming technique in the procedure shown in FIG. 9A.

Next, in the procedure shown in FIG. 9B, a resist (not shown) having an opening in an isolation forming region is formed on the silicon nitride film 202, and the silicon nitride film 202 is etched by using the resist as a mask, so as to form a patterned silicon nitride film 202a. Thereafter, the silicon oxide film 201 is etched into a silicon oxide film 201a by using the resist or the silicon nitride film 202a as a mask, and then, the semiconductor substrate 200 is dry etched so as to form trenches 205a and 205b. The trench 205a is disposed between an active region 203a of an N-type driver transistor of an N-type MIS transistor and a substrate contact region 204, and the trench 205b is disposed between an active region 203b of an N-type access transistor of an N-type MIS transistor and the substrate contact region 204.

Next, in the procedure shown in FIG. 9C, a silicon oxide film 206 is formed over the semiconductor substrate 200 including the inside of the trenches 205a and 205b by plasma CVD using HDP (high density plasma).

Then, in the procedure shown in FIG. 9D, the silicon oxide film 206 is polished and removed by CMP until the surface of the silicon nitride film 202a is exposed, and thus, isolation insulating films 206a and 206b made of the silicon oxide film are formed in the trenches 205a and 205b.

Subsequently, in the procedure shown in FIG. 9E, the silicon nitride film 202a and the silicon oxide film 201a are removed, and thus, an isolation region made of the isolation insulating films 206a and 205b filled in the trenches 205a and 205b is formed.

Thereafter, a P-type well region 207, a P-type impurity region 218, gate insulating films 208a and 208b, gate electrodes 209a, 209b and 209c, a sidewall 210, N-type source/drain regions 211a and 211b, a metal silicide film 212, a liner film 213, an interlayer insulating film 214, contact plugs 215a through 215j, an interlayer insulating film 216 and metal lines 217a through 217h shown in FIG. 8 are formed by employing known techniques.

In this manner, a semiconductor device equipped with an SRAM including access transistors and driver transistors is fabricated.

The conventional semiconductor device equipped with an SRAM has, however, the following problems:

In the case where the isolation region is formed in the semiconductor substrate 200 by filling the trenches 205a and 205b with the isolation insulating films 206a and 206b by the method shown in FIGS. 9A through 9E, there arises a problem that large stress is applied by the isolation region to the active region 200a of the first driver transistor, the active region 200b of the second driver transistor, the active region 200c of the first access transistor and the active regions 200d of the second access transistor shown in FIGS. 8A and 8B. This is because stress derived from a difference in the thermal expansion coefficient between silicon and a silicon oxide film and from oxidation of a silicon substrate is caused around the isolation region in the procedure for filling the trenches with the silicon oxide films and annealing procedure for oxidation/activation annealing or the like.

The stress is increased as the width of the trench is reduced for the refinement, and the stress not only degrades the performances of the transistors but also may cause crystal defects or dislocation, leakage of a diffusion layer or a well, or a short-circuit between elements. As a result, the semiconductor device equipped with an SRAM has problems that the increase of the degree of integration is inhibited, that the improvement of the performance is suppressed and that the power consumption is increased.

SUMMARY OF THE INVENTION

The present invention was devised to overcome the aforementioned problems, and an object of the invention is providing a semiconductor device equipped with an SRAM in which characteristic variation among MIS transistors caused by stress applied by an isolation region is suppressed and a method for fabricating the same.

The semiconductor device of this invention is equipped with an SRAM including a first MIS transistor, and includes a first active region of the first MIS transistor made of a portion of a semiconductor substrate partitioned by an isolation region; and a substrate contact region made of another portion of the semiconductor substrate partitioned by the isolation region, and the first active region and the substrate contact region are not separated from each other by the isolation region.

In the semiconductor device of this invention, the first active region and the substrate contact region are not separated from each other by the isolation region but are integrally formed. Therefore, in the first MIS transistor, the length along the gate length direction of the active region is increased, and hence, stress applied by the isolation region to a channel region of the first MIS transistor is reduced. As a result, the characteristic variation caused by the stress applied by the isolation region can be reduced.

The semiconductor device of the invention may further include a first dummy gate electrode formed in a position sandwiched between the first active region and the substrate contact region on the semiconductor substrate, and the first dummy gate electrode may be electrically connected to the substrate contact region. Thus, the first dummy gate electrode is fixed to ground potential, and hence, the first active region and the substrate contact region can be electrically separated from each other.

The semiconductor device of the invention may further include an interlayer insulating film provided on the semiconductor substrate; and a shared contact penetrating through the interlayer insulating film and electrically connected to the substrate contact region and the first dummy gate electrode.

The semiconductor device of the invention may further include an interlayer insulating film provided on the semiconductor substrate; a contact plug disposed on the interlayer insulating film and electrically connected to the substrate contact region; and a line electrically connected to the contact plug, and the substrate contact region may be grounded by the contact plug and the line.

In the semiconductor device of the invention, the first MIS transistor may be an access transistor.

In the semiconductor device of the invention, the SRAM may further include a second MIS transistor, a second active region of the second MIS transistor may be made of a portion of the semiconductor substrate partitioned by the isolation region, and the second active region and the substrate contact region may not be separated from each other by the isolation region.

In the semiconductor device of the invention, the second MIS transistor may be a driver transistor.

The semiconductor device of the invention may further include a second dummy gate electrode formed in a position between the second active region and the substrate contact region on the semiconductor substrate, the first MIS transistor may be an access transistor, and the second dummy gate electrode may have a shorter gate length than the first dummy gate electrode.

The method of this invention for fabricating a semiconductor device equipped with an SRAM including a MIS transistor, includes the step of forming, in a semiconductor substrate, an isolation region for partitioning an active region of the MIS transistor and a substrate contact region, and the active region and the substrate contact region are not separated from each other by the isolation region in the step of forming an isolation region.

In the method for fabricating a semiconductor device of this invention, since the active region and the substrate contact region are not separated from each other by the isolation region but are integrally formed, the length along the gate length direction of the MIS transistor can be increased.

Accordingly, in the semiconductor device fabricated by this method, the stress applied by the isolation region to a channel region of the MIS transistor is reduced. As a result, the characteristic variation caused by the stress applied by the isolation region can be reduced.

The method for fabricating a semiconductor device of this invention may further include the step of forming a dummy gate electrode electrically connected to the substrate contact region in a position sandwiched between the active region and the substrate contact region on the semiconductor substrate. In the semiconductor device fabricated by this method, the dummy gate electrode is fixed to ground potential, and therefore, the active region and the substrate contact region can be electrically separated from each other.

DETAILED DESCRIPTION OF THE INVENTION

Embodiment 1

A semiconductor device according to Embodiment 1 of the invention will now be described with reference to FIGS. 1A through 1C.

Figure 1A:
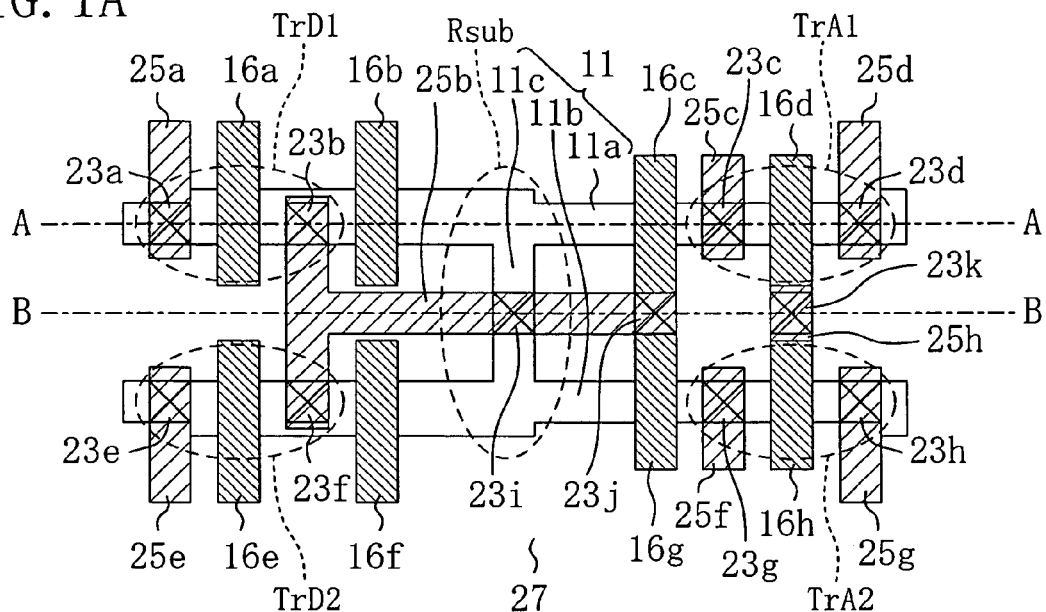
FIG. 1A is a schematic plan view of a semiconductor device equipped with an SRAM according to Embodiment 1 of the invention.
Figure 1B:
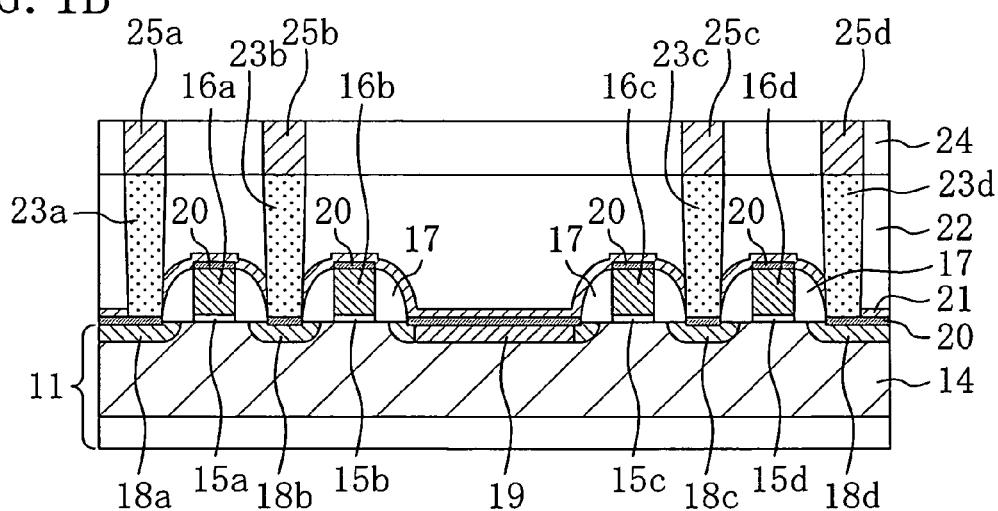
FIG. 1B is a cross-sectional view thereof taken on line A-A of FIG. 1A
Figure 1C:
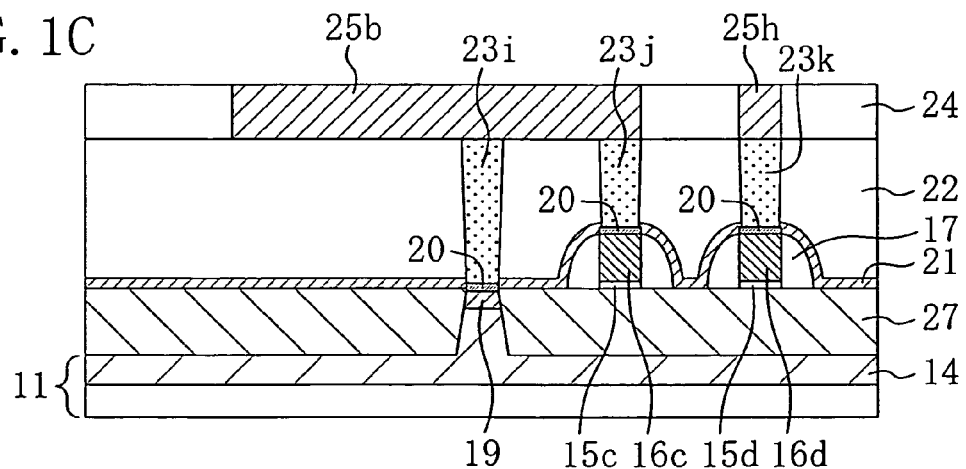
FIG. 1C is a cross-sectional view thereof taken on line B-B of FIG. 1A.

FIG. 1A is a schematic plan view of the semiconductor device equipped with an SRAM according to this embodiment, FIG. 1B is a cross-sectional view thereof taken on line A-A of FIG. 1A and FIG. 1C is a cross-sectional view thereof taken on line B-B of FIG. 1A. It is noted that active regions of transistors and a substrate contact region made of a semiconductor substrate surrounded by an isolation insulating film, gate electrodes, dummy gate electrodes, contact plugs and metal lines are extracted to be shown in FIG. 1A. In other words, an interlayer insulating film, a sidewall, a metal silicide layer and an impurity diffusion layer shown in FIGS. 1B and 1C are omitted in FIG. 1A for convenience sake. Furthermore, MIS transistors apart from N-type driver transistors and N-type access transistors out of all MIS transistors included in an SRAM cell are omitted to be described and shown in this embodiment.

The semiconductor device of this embodiment includes, as shown in FIG. 1A, a first driver transistor TrD1, a second driver transistor TrD2, a first access transistor TrA1, a second access transistor TrA2 and a substrate contact region Rsub.

The driver transistors TrD1 and TrD2, the access transistors TrA1 and TrA2 and the substrate contact region Rsub are formed in and on a semiconductor substrate 11. The semiconductor substrate 11 is surrounded by an isolation insulating film 27 in a plan view. Also, the surface of the semiconductor substrate 11 shown in a plan view has two regions 11a and 11b parallel to each other and a region 11c for connecting the regions 11a and 11b to each other at their centers. In other words, the substrate 11 has a surface in a plan shape of transverse "H". However, each of the both ends of the regions 11a and 11b may or may not be connected to an active region of another transistor. The region 11c corresponds to the substrate contact region Rsub. The center of the region 11a is in contact with the end (the upper end in the drawing) of the region 11c. A portion of the region 11a disposed on the left hand side of a connecting portion with the region 11c corresponds to an active region of the first driver transistor TrD1. Another portion of the region 11a disposed on the right hand side of the connecting portion with the region 11c corresponds to an active region of the first access transistor TrA1.

On the other hand, a portion of the region 11b disposed on the left hand side of a connecting portion with the region 11c corresponds to an active region of the second driver transistor TrD2. Another portion of the region 11b disposed on the right hand side of the connecting portion with the region 11c corresponds to an active region of the second access transistor TrA2.

The first driver transistor TrD1 includes, as shown in FIG. 1B, a gate insulating film 15a and a gate electrode 16a formed on a P-type well 14 in the semiconductor substrate 11, a sidewall 17 formed on the side face of the gate electrode 16a, N-type source/drain regions 18a and 18b formed below portions on sides of the sidewall 17 in the semiconductor substrate 11 and a metal silicide film 20 formed on the N-type source/drain regions 18a and 18b and the gate electrode 16a.

The second driver transistor TrD2 includes a gate electrode 16e as shown in FIG. 1A, and although its cross-sectional view is omitted, it has a similar structure to the first driver transistor TrD1.

The first access transistor TrA1 includes, as shown in FIG. 1B, a gate insulating film 15d and a gate electrode 16d formed on the P-type well region 14 in the semiconductor substrate 11, a sidewall 17 formed on the side face of the gate electrode 16d, N-type source/drain regions 18c and 18d formed below portions on sides of the sidewall 17 in the semiconductor substrate 11 and a metal silicide film 20 formed on the N-type source/drain regions 18c and 18d and the gate electrode 16d.

The second access transistor TrA2 includes a gate electrode 16h made of the same film as that used for forming the gate electrode 16d of the first access transistor TrA1, and although its cross-sectional view is omitted, it has a similar structure to the first access transistor TrA1.

In the substrate contact region Rsub in the semiconductor substrate 11, the P-type well region 14 and a P-type impurity region 19 formed on the P-type well region 14 are formed as shown in FIG. 1B. A metal silicide film 20 is formed on the P-type impurity region 19.

Furthermore, as shown in FIG. 1B, a dummy gate insulating film 15b formed on the P-type well region 14 in the semiconductor substrate 11, a dummy gate electrode 16b formed on the dummy gate insulating film 15b, a sidewall 17 formed on the side face of the dummy gate electrode 16b and a metal silicide film 20 formed on the dummy gate electrode 16b are provided in a region sandwiched between the N-type source/drain region 18b of the first driver transistor TrD1 and the P-type impurity region 19 of the substrate contact region Rsub.

Moreover, as shown in FIG. 1A, a dummy gate electrode 16f is provided in a region sandwiched between the second driver transistor TrD2 and the substrate contact region Rsub. Although the cross-sectional structure of the dummy gate electrode 16f is omitted, the dummy gate electrode 16f has a similar structure to the dummy gate electrode 16b. Although the dummy gate electrodes 16b and 16f are formed in this embodiment, it is not always necessary to provide the dummy gate electrodes 16b and 16f.

Also, as shown in FIG. 1B, a dummy gate insulating film 15c formed on the P-type well region 14 in the semiconductor substrate 11, a dummy gate electrode 16c formed on the dummy gate insulating film 15c, a sidewall 17 formed on the side face of the dummy gate electrode 16c and a metal silicide film 20 formed on the dummy gate electrode 16c are provided in a region sandwiched between the N-type source/drain region 18c of the first access transistor TrA1 and the P-type impurity region 19 of the substrate contact region Rsub.

Furthermore, as shown in FIG. 1A, a dummy gate electrode 16g having a similar structure to the dummy gate electrode 16c is also provided in a region sandwiched between the second access transistor TrA2 and the substrate contact region Rsub.

As shown in FIGS. 1B and 1C, a first interlayer insulating film 22 is formed on the silicide films 20 and the sidewalls 17. Contact plugs 23a through 23k are formed to penetrate through the first interlayer insulating film 22. A second interlayer insulating film 24 is formed on the first interlayer insulating film 22. Metal lines 25a through 25h are formed on the contact plugs 23a through 23k.

As shown in FIG. 1B, in the first driver transistor TrD1, the N-type source/drain region 18a is connected to the metal line 25a through the metal silicide film 20 and the contact plug 23a, and the N-type source/drain region 18b is connected to the metal line 25b through the metal silicide film 20 and the contact plug 23b.

On the other hand, as shown in FIG. 1A, in the second driver transistor TrD2, one of the N-type source/drain regions is connected to the metal line 25e through the metal silicide film and the contact plug 23e and the other is connected to the metal line 25b through the metal silicide film and the contact plug 23f.

Furthermore, as shown in FIG. 1B, in the first access transistor TrA1, the N-type source/drain region 18c is connected to the metal line 25c through the metal silicide film 20 and the contact plug 23c, the N-type source/drain region 18d is connected to the metal line 25d through the metal silicide film 20 and the contact plug 23d, and the gate electrode 16d is connected to the metal line 25h through the metal silicide film 20 and the contact plug 23k.

On the other hand, as shown in FIG. 1A, in the second access transistor TrA2, one of the N-type source/drain regions is connected to the metal line 25f through the metal silicide film and the contact plug 23g, and the other is connected to the metal line 25g through the metal silicide film and the contact plug 23h.

Moreover, as shown in FIG. 1C, the P-type impurity region 19 is connected to the metal line 25b through the metal silicide film 20 and the contact plug 23i in the substrate contact region Rsub.

Herein, the substrate contact region Rsub means a region used for grounding the semiconductor substrate 11 (and more specifically, the P-type well region 14). In the substrate contact region Rsub, the P-type well 14 is connected to the outside of the device through the metal silicide film 20, the contact plug 23i and the metal line 25b, so that the potential of the P-type well region 14 can be externally fixed to 0 V. In the substrate contact region Rsub, the P-type impurity region 19 is formed in an upper portion of the semiconductor substrate 11. The impurity concentration in the P-type impurity region 19 is set to be higher than that in the P-type well region 14, so that the contact resistance between the metal silicide film 20 and the semiconductor substrate 11 can be reduced by the P-type impurity region 19. Also, an active region herein means a region including source/drain regions and a channel region of each transistor.

In the configuration of this embodiment, the active region of the first access transistor TrA1, the active region of the second access transistor TrA2, the active region of the first driver transistor TrD1, the active region of the second driver transistor TrD2 and the substrate contact region Rsub are integrally formed on the continuous semiconductor substrate 11. Therefore, since the length along the gate length direction of the active region is increased in the first access transistor TrA1, a distance from the end of the gate electrode 16d to the end of the active region corresponding to the N-type source/drain region 18c is increased. Accordingly, the characteristic variation caused by stress applied by the isolation insulating film 27 can be reduced. Also in each of the second access transistor TrA2, the first driver transistor TrD1 and the second driver transistor TrD2, the distance to the gate electrode is increased, so as to reduce the influence on the transistor characteristics of the stress applied by the isolation insulating film 27 of the isolation region.

Furthermore, the dummy gate electrodes 16c and 16g are provided for electrically separating the active regions of the access transistors TrA1 and TrA2 from the substrate contact region Rsub. Since the dummy gate electrode 16c is electrically connected to the P-type impurity region 19 of the substrate contact region Rsub through the contact plugs 23i and 23j and the metal line 25b, its potential is fixed to the ground potential equivalent to the potential of the P-type well region 14. Accordingly, a MIS transistor having the dummy gate electrode 16c as a gate electrode is always in an off state. Thus, the N-type source/drain region 18c of the first access transistor TrA1 and the P-type impurity region 19 of the substrate contact region Rsub can be electrically separated from each other. Similarly, the N-type source/drain region of the second access transistor TrA2 can be electrically separated from the P-type impurity region 19 of the substrate contact region Rsub by the dummy gate electrode 16g.

Furthermore, the dummy gate electrodes 16b and 16f are provided between the active regions of the driver transistors TrD1 and TrD2 and the substrate contact region Rsub. Although FIG. 1 shows the dummy gate electrodes 16b and 16f not electrically connected to the outside, they may be connected to the outside. Since the dummy gate electrodes 16b and 16f are thus provided, the pattern density in these regions can be made substantially equivalent to the pattern density in other regions, and hence, the gate electrodes 16a and 16e can be formed in a stable shape. However, it is not always necessary to provide the dummy electrodes 16b and 16f in this embodiment. This is because the P-type impurity region 19 of the substrate contact region Rsub, the active region of the first driver transistor TrD1 (specifically, a portion of the active region connected to the contact plug 23b) and the active region of the second driver transistor TrD2 (specifically, a portion of the active region connected to the contact plug 23f) are respectively grounded, and hence, there is no need to separate these regions by the dummy electrodes 16b and 16f.

Moreover, the gate length of the dummy gate electrodes 16c and 16g may be longer than the gate length of the dummy gate electrodes 16b and 16f. This is because although the dummy gate electrodes 16b and 16f are not always necessary as described above, the dummy gate electrodes 16c and 16g are required to definitely separate the substrate contact region Rsub from the active regions of the access transistors TrA1 and TrA2. When the gate length of the dummy gate electrodes 16c and 16g is longer than the gate length of the dummy gate electrodes 16b and 16f, the substrate contact region Rsub can be definitely separated from the active regions of the access transistors TrA1 and TrA2 by the dummy gate electrodes 16c and 16g, so as to suppress leakage current.

Now, a method for fabricating the semiconductor device of this embodiment will be described with reference to FIGS. 2A through 2D, 3A through 3D, 4A through 4D, 5A through 5D, 6A and 6B.

FIGS. 2A through 2D and 3A through 3D are cross-sectional views for showing procedures in the fabrication method for the semiconductor device of this embodiment taken on line B-B of FIG. 1A. Also, FIGS. 4A through 4D and 5A through 5D are cross-sectional views for showing the procedures in the fabrication method for the semiconductor device of this embodiment taken on line A-A of FIG. 1A. The procedures shown in FIGS. 2A through 3D respectively correspond to the procedures shown in FIGS. 4A through 5D.

Figure 2A:
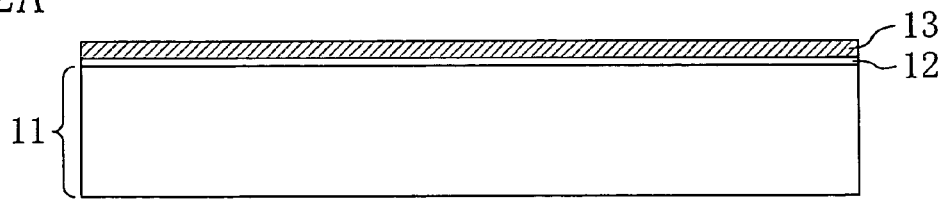
FIGS. 2A, 2B, 2C and 2D are cross-sectional views for showing procedures in a method for fabricating the semiconductor device of Embodiment 1 taken on line B-B of FIG. 1A.
Figure 4A:
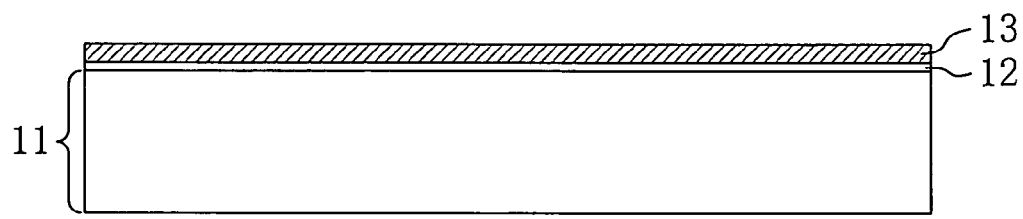
FIGS. 4A, 4B, 4C and 4D are cross-sectional views for showing procedures in the method for fabricating the semiconductor device of Embodiment 1 taken on line A-A of FIG. 1A.

In the fabrication method of this embodiment, in the procedure shown in FIGS. 2A and 4A, a silicon oxide film ($SiO_2$ film) 12 with a thickness of 5 through 20 nm is first formed on a semiconductor substrate 11 and thereafter, a silicon nitride film ($Si_3N_4$ film) 13 with a thickness of 50 through 150 nm is formed on the silicon oxide film 12.

Figure 2B:
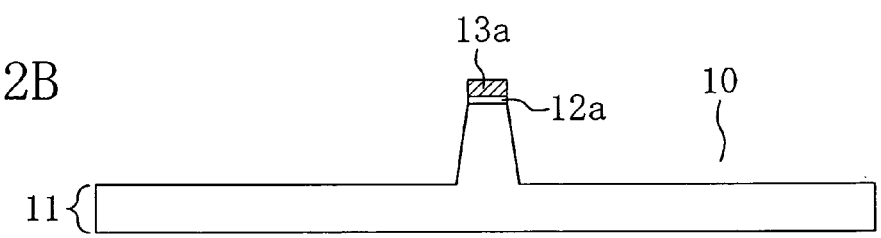
Figure 4B:
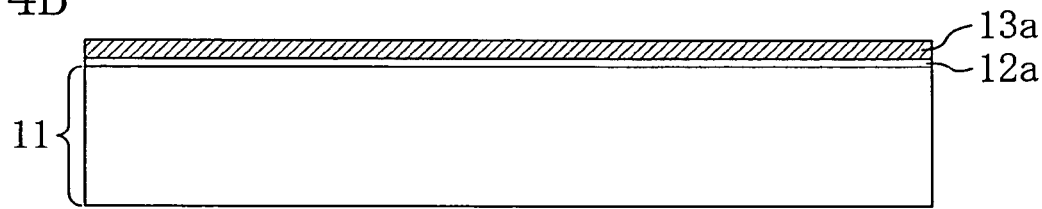

Next, in the procedure shown in FIGS. 2B and 4B, after forming a resist (not shown) having an opening in an isolation forming region on the silicon nitride film 13, etching is performed with the resist used as a mask, so as to pattern the silicon nitride film 13 into a protecting film 13a. Thereafter, the etching is performed by using the resist or the protecting film 13a as a mask, so as to form an underlying film 12a made of the silicon oxide film 12. Then, the semiconductor substrate 11 is dry etched so as to form trenches 10 with a depth of 250 through 400 nm.

Figure 6A:
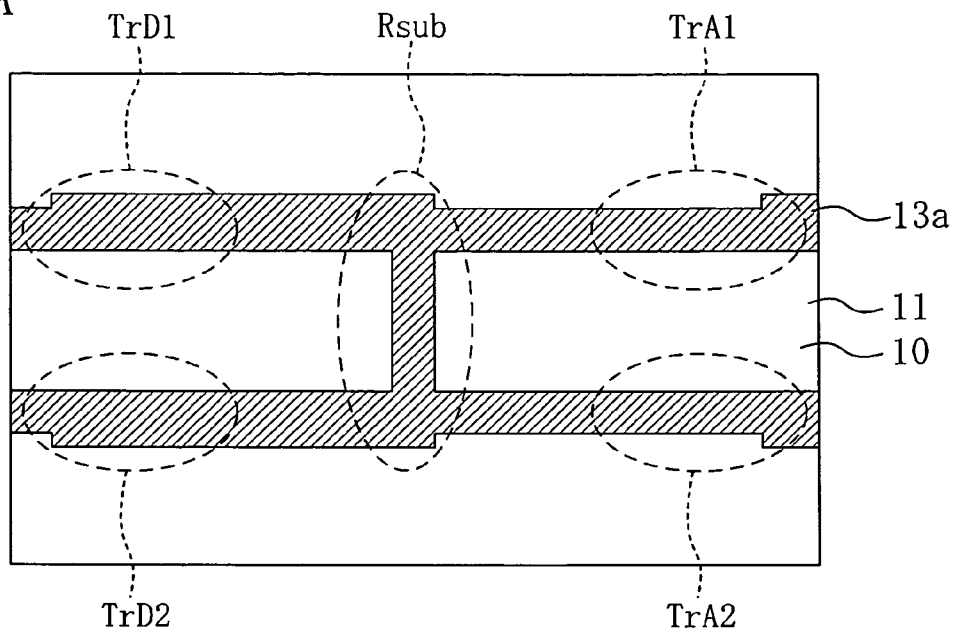
FIG. 6A is a plan view of a substrate surface obtained in the procedure shown in FIGS. 2B and 4B and FIG. 6B is a plan view of the substrate surface obtained in the procedure shown in FIGS. 2D and 4D.

FIG. 6A is a plan view of the substrate surface obtained in the procedure shown in FIGS. 2B and 4B. As shown in FIG. 6A, the protecting film 13a is formed in this procedure so that a portion on the semiconductor substrate 11 where active regions of driver transistors TrD1 and TrD2, active regions of access transistors TrA1 and TrA2 and a substrate contact region Rsub are to be formed can be covered and that the active regions and the substrate contact region Rsub can be integrated with one another. The trenches 10 are formed in portions where the protecting film 13a is not formed. In other words, the trenches 10 are formed so as to surround the active regions of the driver transistors TrD1 and TrD2, the active regions of the access transistors TrA1 and TrA2 and the substrate contact region Rsub on the semiconductor substrate 11. These trenches 10 determine the dimensions of the active regions of the driver transistors TrD1 and TrD2, the active regions of the access transistors TrA1 and TrA2 and the substrate contact region Rsub.

Figure 2C:
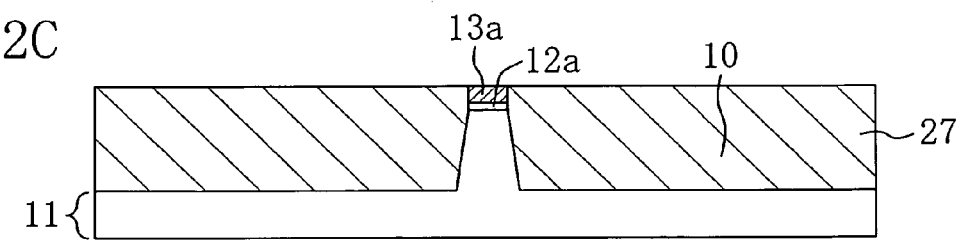
Figure 4C:
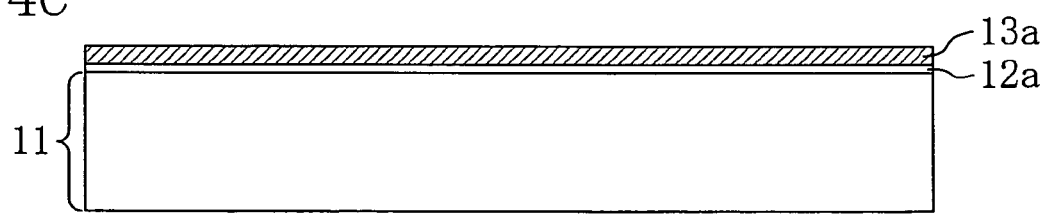

Next, in the procedure shown in FIGS. 2C and 4C, a silicon oxide film with a thickness of 600 nm is formed over the semiconductor substrate 11 including the surfaces of the trenches 10 by plasma CVD using HDP. Thereafter, the silicon oxide film is polished and removed by CMP until the surface of the protecting film 13a is exposed, so as to form an isolation region of an isolation insulating film 27 made of the silicon oxide film within the trenches 10. It is noted that an etching damage layer may be removed by thermally oxidizing the surface of the semiconductor substrate 11 exposed within the trenches 10 before forming the silicon oxide film.

Figure 2D:
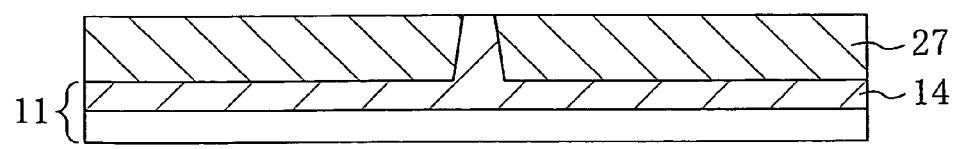
Figure 4D:
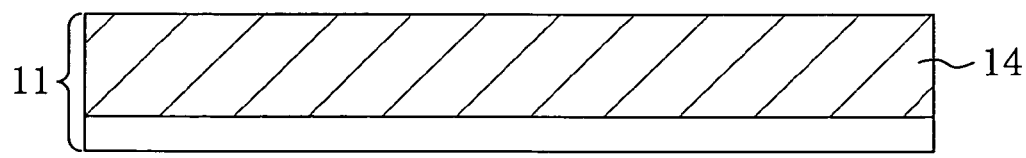
Figure 6B:
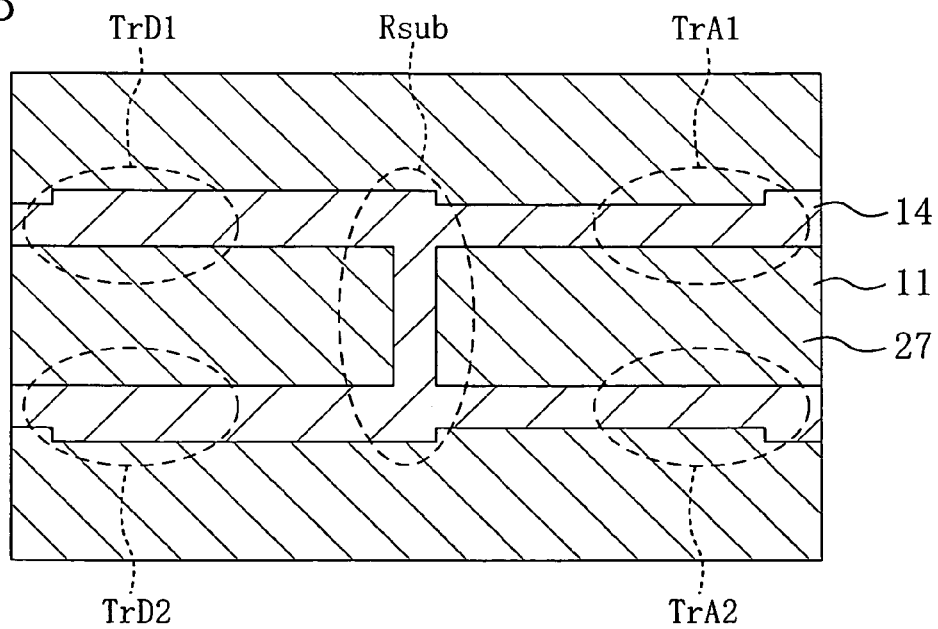

Next, in the procedure shown in FIGS. 2D and 4D, after removing the protecting film 13a, P-type impurity ions are implanted into the semiconductor substrate 11, so as to form a P-type well region 14. Thereafter, the underlying film 12a is removed. FIG. 6B is a plan view of the substrate surface obtained in the procedure shown in FIGS. 2D and 4D. As shown in FIG. 6B, the portion on the semiconductor substrate 11 where the active regions of the driver transistors TrD1 and TrD2, the active regions of the access transistors TrA1 and TrA2 and the substrate contact region Rsub are to be formed is surrounded by the isolation insulating film 27 in this procedure.

Figure 3A:
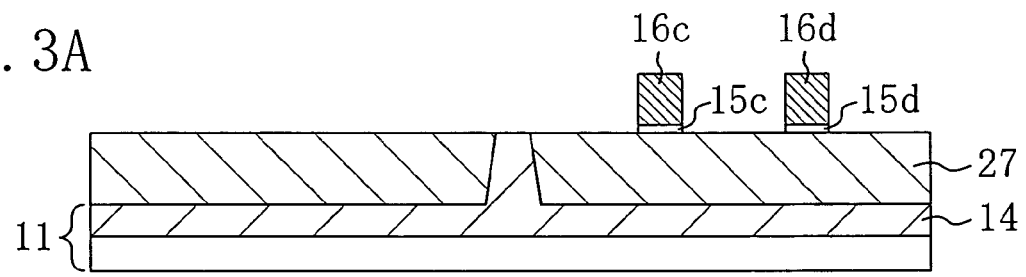
FIGS. 3A, 3B, 3C and 3D are cross-sectional views for showing other procedures in the method for fabricating the semiconductor device of Embodiment 1 taken on line B-B of FIG. 1A.
Figure 5A:
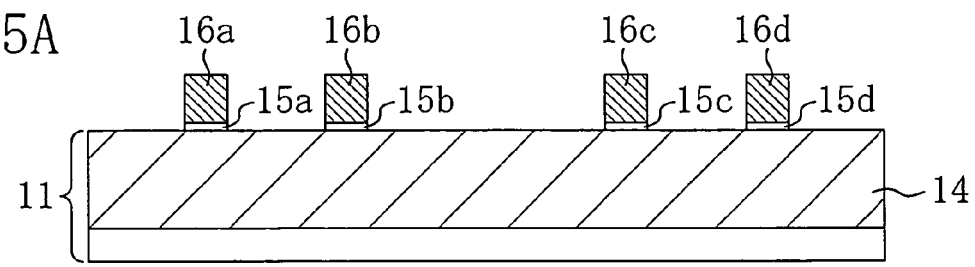
FIGS. 5A, 5B, 5C and 5D are cross-sectional views for showing other procedures in the method for fabricating the semiconductor device of Embodiment 1 taken on line A-A of FIG. 1A.

Then, in the procedure shown in FIGS. 3A and 5A, after forming a silicon oxynitride film with a thickness of 2 nm on the semiconductor substrate 11, a polysilicon film with a thickness of 150 nm is formed on the silicon oxynitride film. Thereafter, the polysilicon film and the silicon oxynitride film are patterned by photolithography and dry etching, so as to form a gate insulating film 15a and a gate electrode 16a of the first driver transistor TrD1 and a gate insulating film 15d and a gate electrode 16d of the first access transistor TrA1. Simultaneously, a dummy gate insulating film 15b and a dummy gate electrode 16b are formed between the active region of the first driver transistor TrD1 and the substrate contact region Rsub, and a dummy gate insulating film 15c and a dummy gate electrode 16c are formed between the active region of the first access transistor TrA1 and the substrate contact region Rsub. Then, N-type impurity ions are implanted by using the gate electrodes 16a and 16d as a mask, so as to form an N-type extension region (not shown).

Figure 3B:
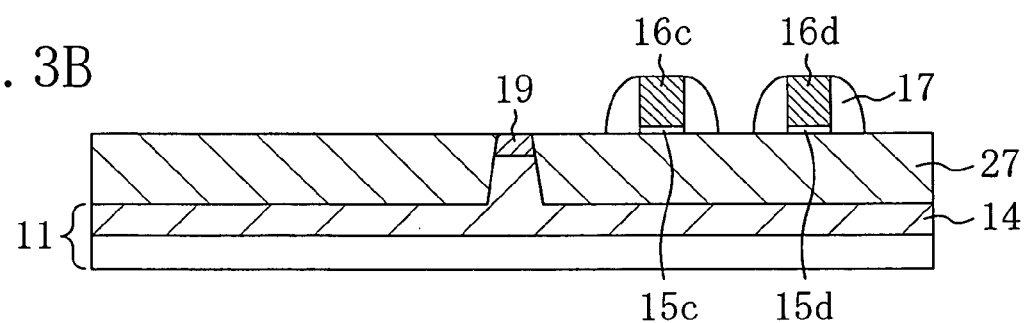
Figure 5B:
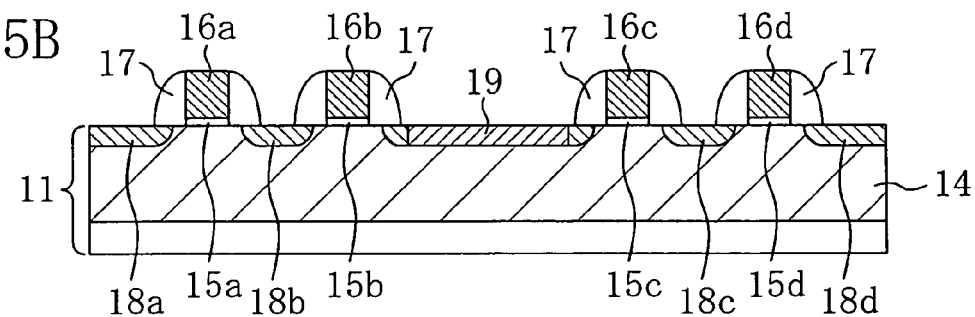

Next, in the procedure shown in FIGS. 3B and 5B, an insulating sidewall 17 is formed on the side faces of the gate electrodes 16a and 16d and the dummy gate electrodes 16b and 16c. The sidewall 17 may be made of a silicon oxide film, a silicon nitride film or a multilayered film of these films. Also, an offset spacer may be formed between each electrode and the sidewall 17. Thereafter, N-type impurity ions are selectively implanted into the active regions of the first driver transistor TrD1 and the first access transistor TrA1 with the gate electrodes 16a and 16d and the sidewall 17 used as a mask, so as to form N-type source/drain regions 18a, 18b, 18c and 18d. Furthermore, P-type impurity ions are selectively implanted into the substrate contact region Rsub with the dummy gate electrodes 16b and 16c and the sidewall 17 used as a mask, so as to form a P-type impurity region 19.

Figure 3C:
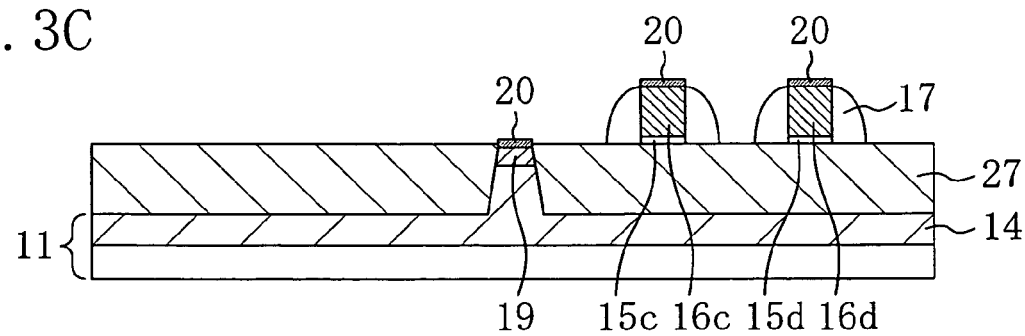
Figure 5C:
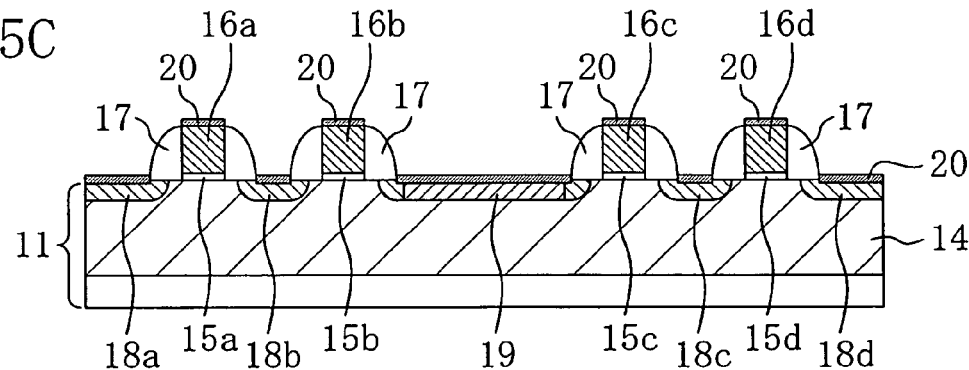

Then, in the procedure shown in FIGS. 3C and 5C, after forming a metal film of nickel (Ni), cobalt (Co) or the like over the semiconductor substrate 11, annealing is performed for allowing an exposed portion of the silicon to react with the metal, thereby forming a metal silicide film 20 selectively on the gate electrodes 16a and 16d, the dummy gate electrodes 16b and 16c, the N-type source/drain regions 18a, 18b, 18c and 18d and the P-type impurity region 19. Thereafter, an unreacted portion of the metal film is selectively removed.

Figure 3D:
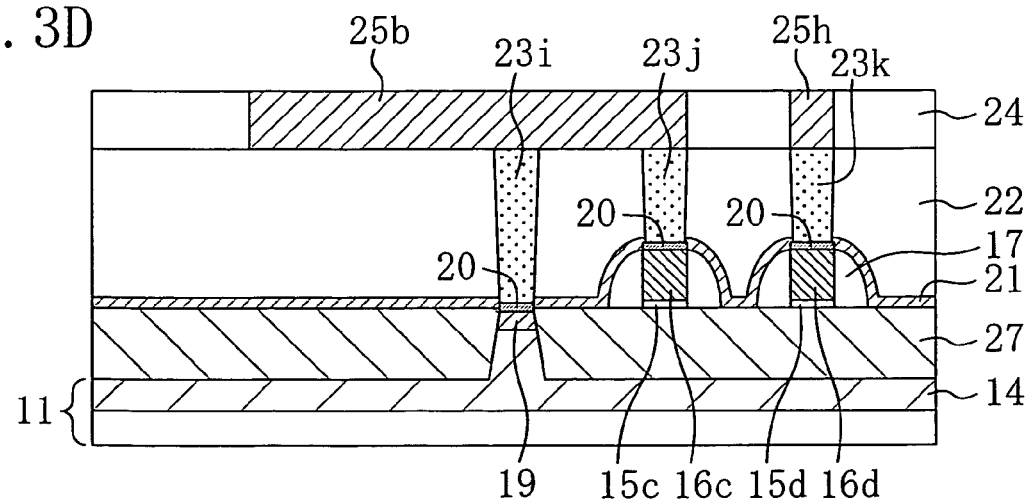
Figure 5D:
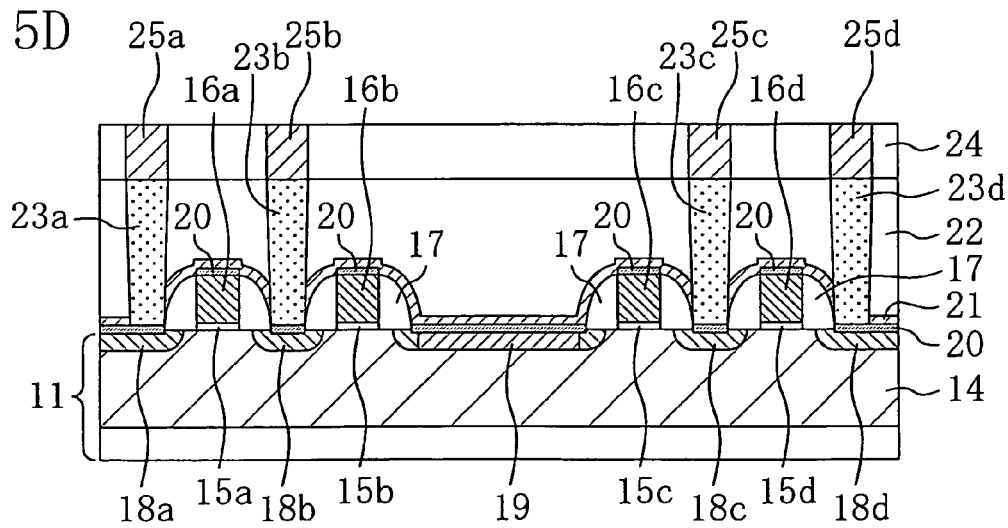

Subsequently, in the procedure shown in FIGS. 3D and 5D, after forming a liner film 21 made of a silicon nitride film over the semiconductor substrate 11, a first interlayer insulating film 22 is formed on the liner film 21. Thereafter, the first interlayer insulating film 22 and the liner film 21 are etched so as to form contact holes, and the contact holes are filled with a conducting material, thereby forming contact plugs 23a, 23b, 23c, 23d, 23i, 23j and 23k. Then, after forming a second interlayer insulating film 24 on the first interlayer insulating film 22, line grooves are formed in the second interlayer insulating film 24 and the line grooves are selectively filled with a metal material, thereby forming metal lines 25a, 25b, 25c, 25d and 25h. At this point, the dummy gate electrode 16c is electrically connected to the P-type impurity region 19 through the metal silicide film 20 formed on the dummy gate electrode 16c, the contact plug 23j, the metal line 25b, the contact plug 23i and the metal silicide film 20 formed on the P-type impurity region 19, so as to attain the same potential as the P-type impurity region 19. Also, the N-type source/drain region 18c formed between the gate electrode 16d and the dummy gate electrode 16c is connected to the metal line 25c used as a bit line through the metal silicide film 20 and the contact plug 23c. In this manner, the semiconductor device of this embodiment is fabricated.

Embodiment 2

Figure 7A:
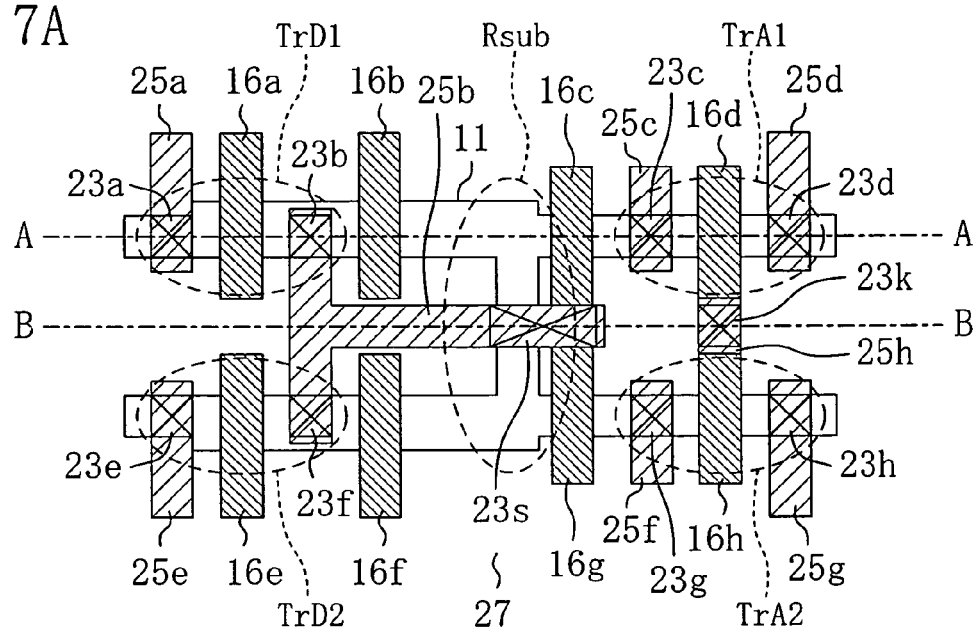
FIG. 7A is a schematic plan view of a semiconductor device equipped with an SRAM according to Embodiment 2 of the invention.
Figure 7B:
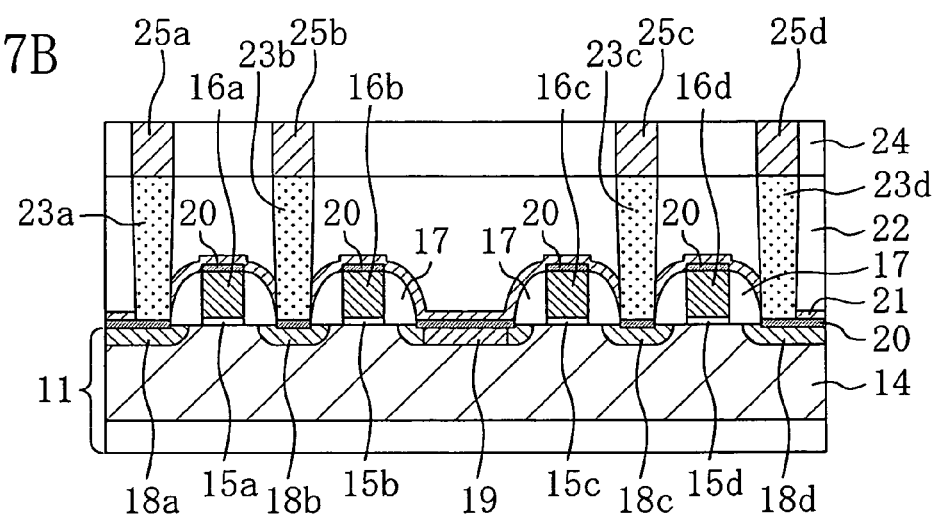
FIG. 7B is a cross-sectional view thereof taken on line A-A of FIG. 7A
Figure 7C:
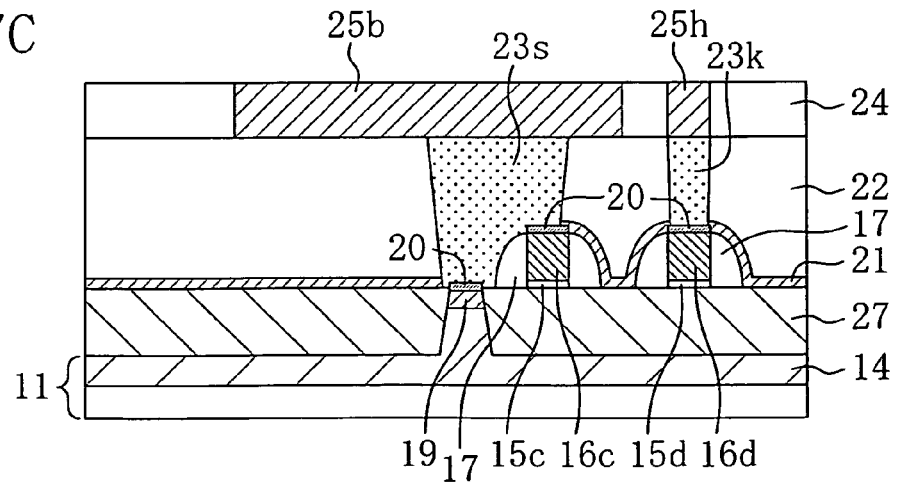
FIG. 7C is a cross-sectional view thereof taken on line B-B of FIG. 7A.
Figure 8A:
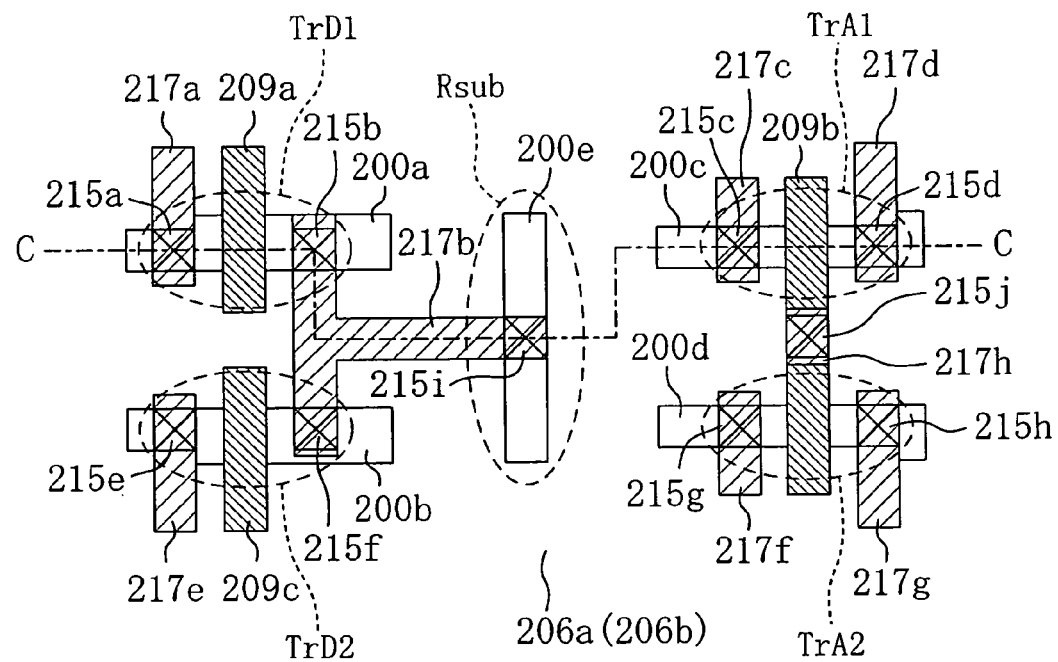
FIGS. 8A and 8B are a plan view and a cross-sectional view for showing the structure of a conventional semiconductor device equipped with an SRAM.
Figure 8B:
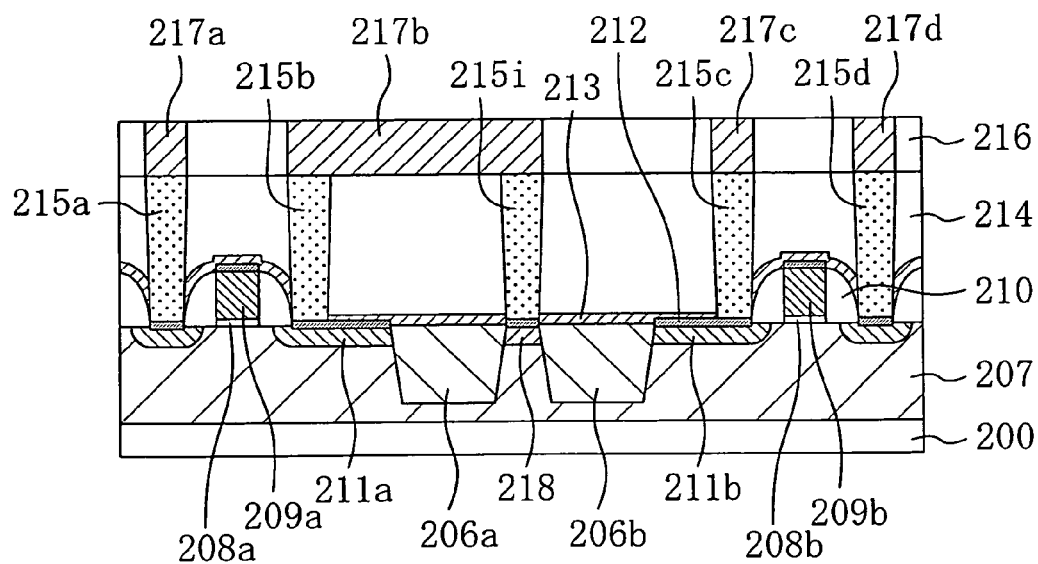
Figure 9A:
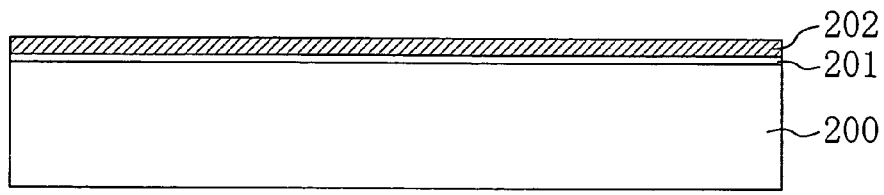
FIGS. 9A, 9B, 9C, 9D and 9E are cross-sectional views for showing procedures in fabrication of the conventional semiconductor device equipped with an SRAM.
Figure 9B:
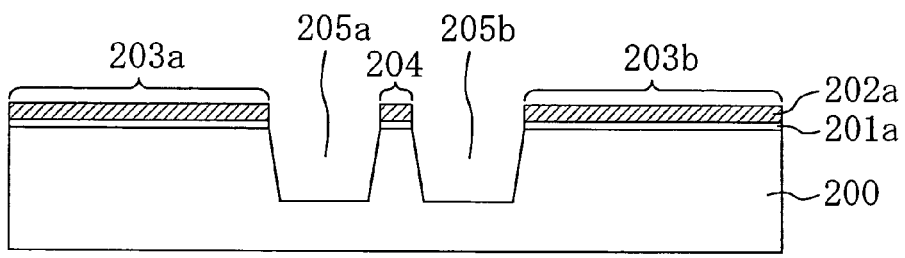
Figure 9C:
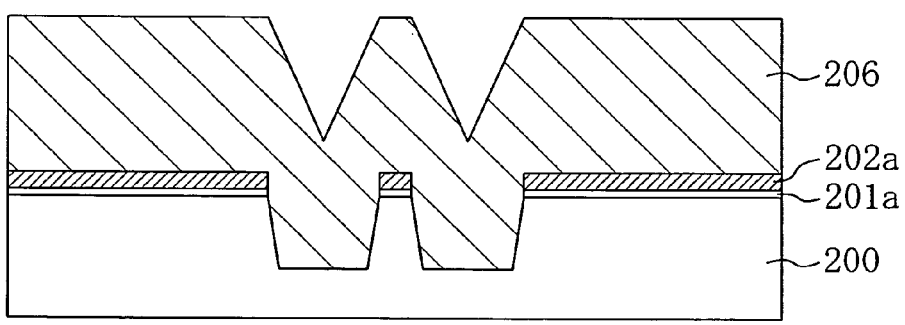
Figure 9D:
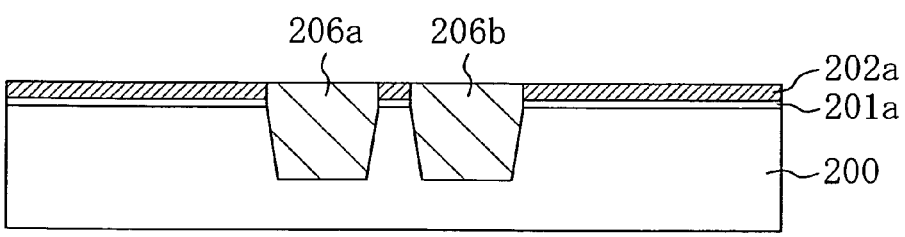
Figure 9E:
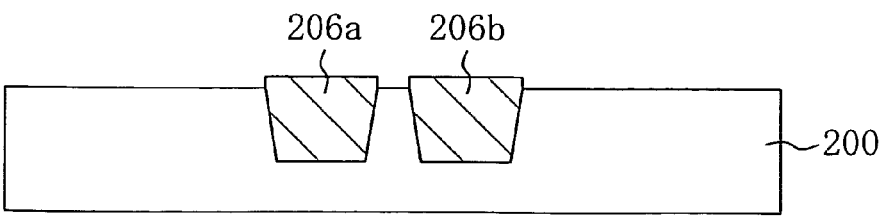

A semiconductor device according to Embodiment 2 of the invention will now be described with reference to FIGS. 7A through 7C. FIG. 7A is a schematic plan view of the semiconductor device equipped with an SRAM of this embodiment, FIG. 7B is a cross-sectional thereof taken on line A-A of FIG. 7A and FIG. 7C is a cross-sectional view thereof taken on line B-B of FIG. 7A.

A difference of the semiconductor device of this embodiment from that of Embodiment 1 is that a substrate contact region Rsub and dummy gate electrodes 16c and 16g are connected to one shared contact 23s. Specifically, while the substrate contact region Rsub is connected to the contact plug 23i and the dummy gate electrodes 16c and 16g are connected to the contact plug 23j as shown in FIGS. 1A and 1C in Embodiment 1, these contact plugs are shared as the shared contact 23s as shown in FIG. 7A in this embodiment. More specifically, as shown in FIG. 7C, the shared contact 23s is formed to cover a metal silicide layer 20 provided in the substrate contact region Rsub, a sidewall 17 provided on the side face of the dummy gate electrode 16c and a metal silicide layer 20 provided on the dummy gate electrode 16c. A metal line 25b is formed on the shared contact 23s. The substrate contact region Rsub and the dummy gate electrode 16c (and the dummy gate electrode 16g) are kept at the same potential by the shared contact 23s, the metal line 25b and the metal silicide layer 20. The rest of the configuration is the same as that of Embodiment 1 and hence the description is omitted.

In this embodiment, the same effects as those attained in Embodiment 1 can be attained. Furthermore, since the shared contact 23s is formed, the area of the device can be reduced as compared with the case where the two contact plugs are formed as in Embodiment 1.

Alternative Embodiment

In each of the aforementioned embodiments, the plane surface of the semiconductor substrate 11 is in the transverse "H" shape, to which the shape of the surface of the semiconductor substrate 11 is not limited. Specifically, the surface of the semiconductor substrate may be in any shape as far as active regions of transistors and a substrate contact region, which are conventionally separated from one another by an isolation region, are integrated with one another.

What is claimed is:

1. A semiconductor device equipped with an SRAM, the SRAM including:
    a semiconductor region surrounded by an isolation region, the semiconductor region being formed on a semiconductor substrate;
    a first MIS transistor disposed in a first region of the semiconductor region, the first MIS transistor comprising a first gate electrode formed on an first active region in the first region, a first source/drain region of a first conductive type formed in the first region and a second source/drain region of the first conductive type formed in the first region; and
    a substrate contact region for grounding the semiconductor substrate, the substrate contact region being disposed on a second region of the semiconductor region, the substrate contact region comprising an impurity region of a second conductive type,
    wherein the first region and the second region are formed within the semiconductor region and not partitioned from each other by the isolation region.

2. The semiconductor device of claim 1, wherein the substrate contact region is grounded.

3. The semiconductor device of claim 1, wherein the SRAM further comprising:
    a first dummy gate electrode disposed in the first region and between the first source/drain region and the substrate contact region,
    wherein the first dummy gate electrode is electrically connected to the substrate contact region through a metal line or a shared contact.

4. The semiconductor device of claim 1, wherein the first MIS transistor is an access transistor of the SRAM.

5. The semiconductor device of claim 1, wherein the SRAM further comprising:
    a second MIS transistor disposed in a third region of the semiconductor region, the second MIS transistor comprising a second gate electrode formed on an second active region in the third region, a third source/drain region of a first conductive type formed in the third region and a fourth source/drain region of the first conductive type formed in the third region,
    wherein the first region, the second region and the third region are formed within the semiconductor region and not partitioned from each other by the isolation region.

6. The semiconductor device of claim 5, wherein the substrate contact region is electrically connected to the third source/drain region through a metal line.

7. The semiconductor device of claim 3, wherein the SRAM further comprising:
    a second MIS transistor disposed in a third region of the semiconductor region, the second MIS transistor comprising a second gate electrode formed on an second active region in the third region, a third source/drain region of a first conductive type formed in the third region and a fourth source/drain region of the first conductive type formed in the third region,
    wherein the first region, the second region and the third region are formed within the semiconductor region and not partitioned from each other by the isolation region.

8. The semiconductor device of claim 7, wherein the substrate contact region is electrically connected to the third source/drain region through a metal line.

9. The semiconductor device of claim 7, wherein the SRAM further comprising:
    a second dummy gate electrode disposed in the third region and between the third source/drain region and the substrate contact region.

10. The semiconductor device of claim 9, wherein the second dummy gate electrode has a shorter gate length than the first dummy gate electrode.

11. The semiconductor device of claim 7, wherein the second MIS transistor is a driver transistor of the SRAM.

12. The semiconductor device of claim 7, wherein
    the semiconductor region comprises a first semiconductor region having a first end portion and a second end portion, second semiconductor region and a third semiconductor region,
    the third semiconductor region connects the first and second semiconductor region at a middle portion of each of the first and second semiconductor region forming H shape in a plan view, and
    the first region is disposed in the first end portion, the second region is disposed in the second semiconductor region and the third region is disposed in the second end portion.

13. The semiconductor device of claim 1, wherein a metal suicide film is provided on each of the gate electrode, the first and second source/drain region and the impurity region.

14. The semiconductor device of claim 1, wherein a well region of a second conductivity type is provided in each of the first and second regions, and
    the impurity region is formed on the well region provided in the second region.

15. The semiconductor device of claim 3,
    wherein a well region of a second conductivity type is provided in each of the first and second regions,
    the impurity region is formed on the well region provided in the second region, and
    the first dummy gate electrode is fixed to a same potential as a potential of the well region.

* * * * *